United States Patent
Chau et al.

(10) Patent No.: US 7,936,025 B2
(45) Date of Patent: *May 3, 2011

(54) METAL GATE ELECTRODE FOR PMOS TRANSISTOR

(75) Inventors: Robert Chau, Beaverton, OR (US); Mark Doczy, Beaverton, OR (US); Brian Doyle, Portland, OR (US); Jack Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/231,437

(22) Filed: Sep. 20, 2005

(65) Prior Publication Data

US 2006/0017122 A1    Jan. 26, 2006

Related U.S. Application Data

(60) Continuation of application No. 10/230,944, filed on Aug. 28, 2002, now Pat. No. 6,998,686, which is a division of application No. 10/041,539, filed on Jan. 7, 2002, now Pat. No. 6,696,345.

(51) Int. Cl.
*H01L 29/78* (2006.01)

(52) U.S. Cl. ... 257/407; 257/388; 257/412; 257/E27.06; 257/E29.159

(58) Field of Classification Search ............ 257/288, 257/388, 412, 407, E27.06, E29.159
See application file for complete search history.

(56) References Cited

U.S. PATENT DOCUMENTS

| 5,079,179 A | 1/1992 | Josefowicz et al. |
| 5,188,976 A | 2/1993 | Kume et al. |
| 5,625,217 A | 4/1997 | Chau et al. |
| 5,665,978 A | 9/1997 | Uenoyama et al. |
| 5,671,083 A | 9/1997 | Conner et al. |
| 5,679,589 A | 10/1997 | Lee et al. |
| 5,827,762 A | 10/1998 | Bashir et al. |
| 5,858,843 A | 1/1999 | Doyle et al. |
| 5,880,508 A | 3/1999 | Wu |
| 5,897,365 A | 4/1999 | Matsubara |
| 6,020,024 A | 2/2000 | Maiti et al. |

(Continued)

FOREIGN PATENT DOCUMENTS

EP    0856877    5/1998

OTHER PUBLICATIONS

M. Houssa et al., "Electrical Properties of thin SiON/Ta2O5 gate dielectric stacks", Journal of Applied Physics, vol. 86 No. 11, pp. 6462-6467, Dec. 1999.

(Continued)

*Primary Examiner* — Anh D Mai
(74) *Attorney, Agent, or Firm* — Blakely, Sokoloff, Taylor & Zafman LLP

(57) ABSTRACT

Described is a CMOS transistor structure with a multi-layered gate electrode structure and a method of fabrication. The gate electrode structure has a three-layered metallic gate electrode and a polysilicon layer. The first metallic layer acts as a barrier to prevent the second metallic layer from reacting with an underlying dielectric. The second metallic layer acts to set the work function of the gate electrode structure. The third metallic layer acts as a barrier to prevent the second metallic layer from reacting with the polysilicon layer.

8 Claims, 6 Drawing Sheets

U.S. PATENT DOCUMENTS

| | | | |
|---|---|---|---|
| 6,130,123 A * | 10/2000 | Liang et al. ............... 438/217 |
| 6,166,417 A | 12/2000 | Bai et al. |
| 6,171,950 B1 | 1/2001 | Lee et al. |
| 6,180,454 B1 | 1/2001 | Chang et al. |
| 6,187,633 B1 | 2/2001 | Dong et al. |
| 6,198,144 B1 | 3/2001 | Pan et al. |
| 6,271,087 B1 | 8/2001 | Kinoshita et al. |
| 6,277,722 B1 | 8/2001 | Lee et al. |
| 6,287,913 B1 | 9/2001 | Agnello et al. |
| 6,291,282 B1 * | 9/2001 | Wilk et al. ............... 438/203 |
| 6,300,194 B1 | 10/2001 | Locati et al. |
| 6,340,627 B1 | 1/2002 | Pan |
| 6,365,509 B1 | 4/2002 | Subramanian et al. |
| 6,373,111 B1 * | 4/2002 | Zheng et al. ............... 257/407 |
| 6,373,114 B1 | 4/2002 | Jeng et al. |
| 6,376,348 B1 | 4/2002 | Schrems et al. |
| 6,399,960 B1 * | 6/2002 | Yamazaki et al. ............... 257/59 |
| 6,410,984 B1 | 6/2002 | Trivedi et al. |
| 6,476,454 B2 * | 11/2002 | Suguro ............... 257/410 |
| 6,770,521 B2 * | 8/2004 | Visokay et al. ............... 438/199 |
| 6,974,764 B2 * | 12/2005 | Brask et al. ............... 438/585 |
| 7,030,430 B2 * | 4/2006 | Doczy et al. ............... 257/249 |
| 2003/0151074 A1 | 8/2003 | Zheng et al. |
| 2005/0145893 A1 * | 7/2005 | Doczy et al. ............... 257/288 |

OTHER PUBLICATIONS

H. Shimada, et al., Tantalum Nitride Metal Gate FD-SOI CMOS FETs Using Low Resistivity Self-Grown bcc-Tantalum Layer, IEEE 2001, pp. 1619-1626.

Q. Lu, et al., "Dual Metal Gate Technology for Deep-Submicron CMOS Transistors", IEEE 2000, pp. 72-73.

Y.C. Yee, et al., "Dual Metal Gate CMOS Technology with Ultrathin Silicon Nitride Gate Dielectric", IEEE 2001, pp. 227-229.

A. Chatterjee, et al., Sub-100nm Gate Length Metal Gate NMOS Transistors Fabricated by a Replacement Gate Process. IEDM 1997, pp. 821-824.

I. Polishchuk, et al., "Dual Work Function Metal Gate CMOS Transistor Fabricated by Ni-Ti Interdiffusion", IEEE 2001, pp. 411-414.

* cited by examiner

METAL GATE ELECTRODE FOR PMOS TRANSISTOR

This application is a continuation application of U.S. patent application Ser. No. 10/230,944, entitled "A NOVEL METAL-GATE ELECTRODE FOR CMOS TRANSISTOR APPLICATIONS", and filed on Aug. 28, 2002 now U.S. Pat. No. 6,998,686, which is a divisional of U.S. patent application Ser. No. 10/041,539, entitled "A NOVEL METAL-GATE ELECTRODE FOR CMOS TRANSISTOR APPLICATIONS", and filed on Jan. 7, 2002 now U.S. Pat. No. 6,696,345.

BACKGROUND OF THE INVENTION

1. Field of the Invention

The present invention relates to the field of semiconductor manufacturing and more specifically to a metal gate electrode and its method of fabrication.

2. Discussion of Related Art

A conventional MOS transistor is shown in FIG. 1. On a substrate 110, usually silicon, rests a thin gate dielectric layer 112, usually made of, but not limited to silicon dioxide. Upon the thin gate dielectric layer 112, is a gate electrode 120, an electrically conductive material. Together the thin gate dielectric layer 112 and the gate electrode form a gate structure 122. Adjacent to the gate structure 122 are spacers 130, made of a dielectric material. The spacers 130 are aligned directly over shallow junctions 128 of source 124 and drain 126. The source 124 and drain 126 have deeper regions 132 and 134, over which lays a silicide 136, which subsequently can be coupled to metal interconnect lines that run throughout the integrated circuit. Spacers 130 separate the gate structure from the silicide to prevent silicide formation on walls of the gate electrode 120.

When the transistor is in use, the gate structure is electrically charged and a channel region 138 forms beneath the gate allowing current to flow from the source to the drain. Thus, the gate electrode 120 must be an electrically conductive material. Doped polysilicon is the material of choice. In conventional methods of MOS transistor fabrication, the gate structure is formed before the source and drain regions are doped to act as a protective mask to the channel region. The doped polysilicon will prevent the dopants from reacting with the channel region of the underlying substrate. When a charge of the correct polarity is applied to the electrode, the channel region electrically inverts and becomes a conductive path between the source and drain regions. However, polysilicon has its drawbacks. One drawback is polydepletion, or voltage leakage. Another drawback is that polysilicon is highly resistive and therefore presents current flow-problems.

Metal is another material used for the gate electrode. Metal has various advantages over polysilicon as a gate electrode material. For instance, metal allows for excellent current flow and metal has less voltage depletion problems than polysilicon. However, metal too has its drawbacks. Some metals, such as Ti and Ni, are highly diffusive and act as contaminants within the channel region, particularly during the high temperature conditions required for dopant activation of the source/drain implant. Also, certain work functions are required that allow MOS transistors to work optimally, and it is more difficult to manipulate the work function of metals than it is to manipulate the work function of polysilicon. Furthermore, metals are difficult to etch properly. Dry-etch methods are too harsh on underlying Si substrate while wet-etch methods can excessively undercut the sidewalls of the gate electrode.

Some recent methods have attempted to solve some of these problems by combining the conventional methods of forming the transistor, with polysilicon as the gate electrode during doping, with the additional steps of completely etching out the polysilicon after doping and replacing it with a metal. However, this replacement process is complex and can easily result in costly errors if not done correctly. Therefore, it would be advantageous to have a process of making a metal gate electrode, but without the complexity of the current replacement process.

DETAILED DESCRIPTION OF THE INVENTION

Described is a CMOS transistor structure with a multi-layered gate electrode structure and a method of fabrication. The gate electrode structure has a three-layered metallic gate electrode and a polysilicon layer. The first metallic layer acts as a barrier to prevent the second metallic layer from reacting with and diffusing through an underlying dielectric. The second metallic layer acts to set the work function of the gate electrode structure. The third metallic layer acts as a barrier to prevent the second metallic layer from reacting with the polysilicon layer.

The method of fabricating the gate electrode structure includes forming the three metallic layers thick enough that each layer provides the barrier and work-function setting functions mentioned above, but also thin enough that a subsequent wet-etch can be performed without excessive undercutting of the metallic layers. During implant and anneal processes, the polysilicon layer acts as a protective mask over the metallic layers to protect an underlying silicon substrate from interacting with dopants used during the implant process. Furthermore, all three metallic layers should be able to withstand the high temperatures of the annealing.

Gate Electrode Structure

Figure 1:
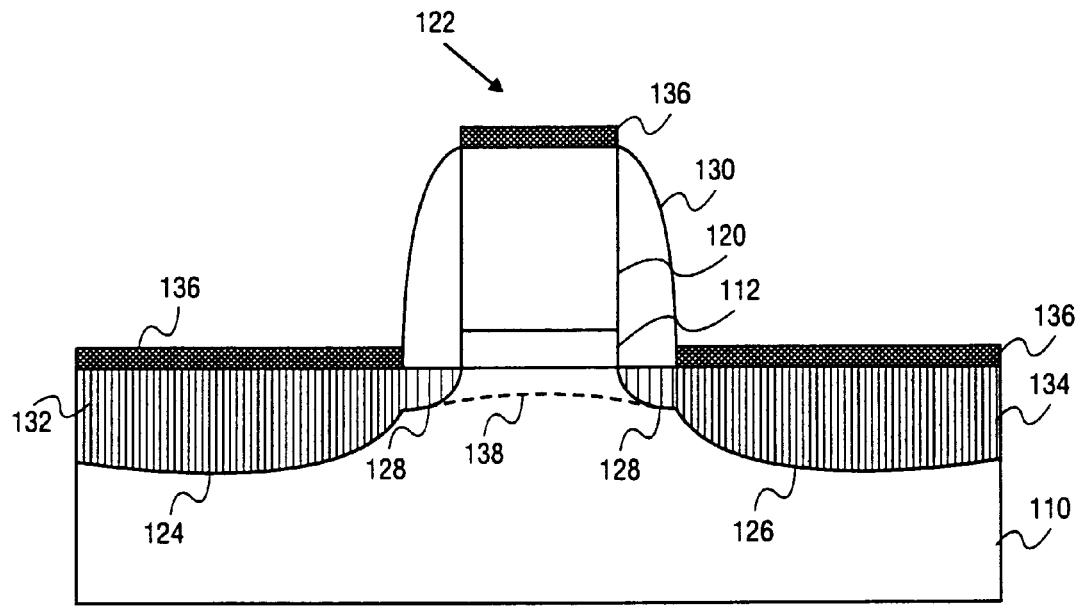
FIG. 1 is an illustration of a cross-sectional view of a transistor structure formed by conventional integrated circuit formation methods.
Figure 2:
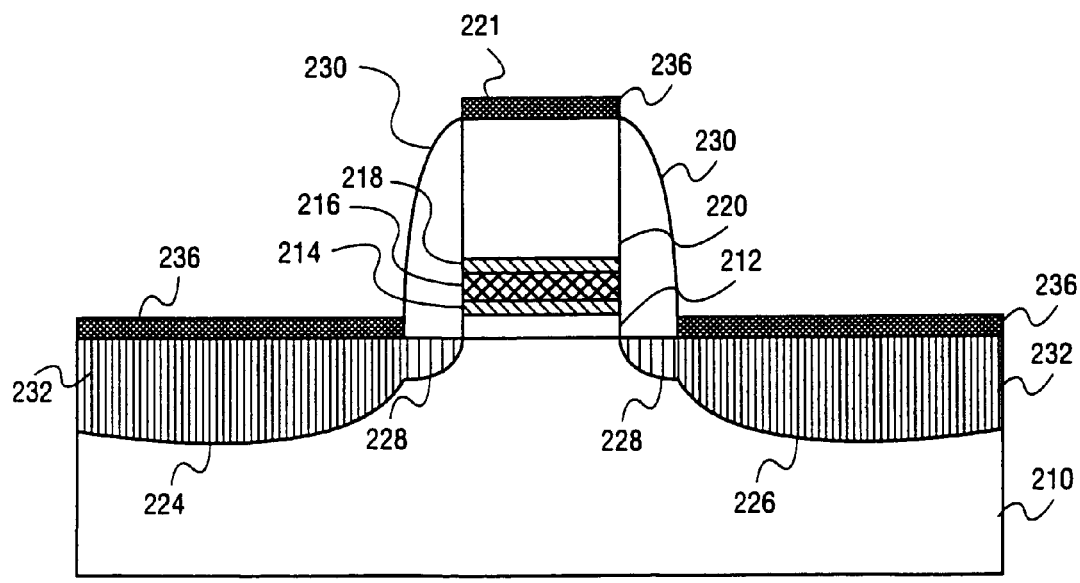
FIG. 2 is an illustration of one embodiment of a transistor structure according to the present invention.

FIG. 2 is an illustration of one embodiment of a transistor structure according to the present invention. A thin gate dielectric layer 212 rests upon a doped monocrystalline silicon substrate 210. Upon the thin gate dielectric layer 212, is a first metallic layer 214 followed by a second metallic layer 216. The first metallic layer 214 acts as a diffusion barrier between the gate dielectric layer 212 and the second metallic layer 216. The second metallic layer 216 sets the overall work function of the gate electrode structure.

For the first metallic layer 214 to act as an effective diffusion barrier, it should be made of a material that resists impurity diffusion and forms a chemically stable interface with the dielectric. But, at the same time, so that the first metallic layer 214 does not interfere with the function of the second metallic layer 216, the first metallic layer 214 should be made of a material with a low density of states or high resistance so that its work function can be easily overwhelmed by that of the second metallic layer 216. Some examples of materials that can be used for the first metallic layer 214, therefore, include metal nitrides such as titanium nitride (TiN) and tantalum nitride (TaN). The barrier properties of the first metallic layer can be enhanced by adding silicon or zirconium.

In addition, the first metallic layer 214 should be thick enough that impurities from the second metallic layer 216 will not diffuse completely through the first metallic layer and into the gate dielectric layer 212. But, at the same time, if the first metallic layer 214 is too thick it may interfere with the function of the second metallic layer 216. Therefore, in one embodiment, the first metallic layer should be approximately 10 to 25 angstroms in thickness.

As stated previously, the second metallic layer 216 sets the overall work function of the gate electrode structure. For a NMOS device, the second metallic layer 216 should be made of a material with a work function of 4.11 eV±0.2 eV. Examples of these materials include titanium, tantalum, zirconium, and hafnium. For a PMOS device, the second metallic layer 216 should be made of a material with a work function of 5.2 eV±0.2 eV. Examples of these materials include platinum, palladium, nickel, cobalt, and ruthenium.

In addition, the second metallic layer 216 should be at least as thick as the first metallic layer 214, so that the second metallic layer can more easily overwhelm the work function of the first metallic layer 214. Therefore, in one embodiment, the second metallic layer is approximately 25 angstroms thick, or greater. For reasons discussed in method below, in one embodiment, the thickness of the second metallic layer 216 should not exceed approximately 150 angstroms.

Returning to the description of FIG. 2, upon the second metallic layer 216 is a third metallic layer 218 followed by a doped polysilicon layer 220. The third metallic layer 218 acts as a silicidation barrier between the second metallic layer 216 and the doped polysilicon layer 220.

For the third metallic layer 218 to act as an effective silicidation barrier, it should be made of a material that is highly resistant to silicidation. Some examples of materials that can be used for the third metallic layer 218, therefore, include titanium nitride (TiN) and tantalum nitride (TaN).

In addition, the third metallic layer should be thick enough to act as an efficient silicidation barrier between the second metallic layer 216 and the doped polysilicon layer 220. Therefore, in one embodiment, the third metallic layer 218 is approximately 25 angstroms thick, or greater. For reasons discussed in the method below, in one embodiment, the thickness of the third metallic layer 218 should not exceed approximately 50 angstroms.

Furthermore, in one embodiment discussed further below, the polysilicon layer 220 acts as a mask during an implant and anneal process. Therefore, the polysilicon layer 220 should be thick enough to prevent ionized dopants from reaching the underlying monocrystalline silicon substrate 210. In one embodiment, therefore, the polysilicon layer is approximately 1000 to 2000 angstroms thick.

Returning again to the embodiment of FIG. 2, the three metallic layers 214, 216, 218 and the doped polysilicon layer form a gate electrode structure 221. Adjacent to the gate electrode structure 221 are spacers 230, made of a dielectric material. The source/drain regions 226, have shallow doped regions 228 and deeply doped regions 232. The spacers 230 are aligned over shallow doped regions 228. Over the deeply doped regions 232, as well as over the gate electrode structure 221, lies a silicide 236, which subsequently can be coupled to metal interconnect lines that run throughout the integrated circuit. Spacers 230 separate the gate structure from the silicide to prevent silicide formation on the walls of the gate electrode structure 221.

Method

Figure 3A:
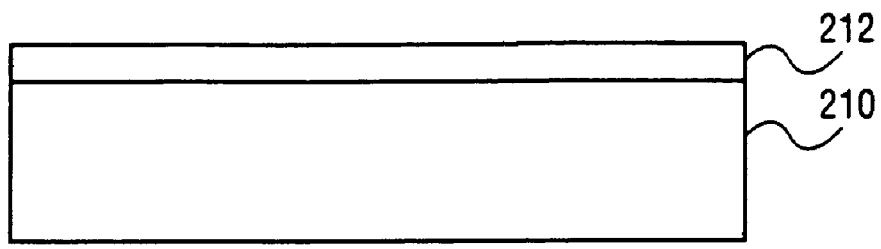
FIGS. 3A-3J represent cross-sectional views of structures that may be formed via one embodiment of a method of the present invention.

The process of forming the transistor structure described above is depicted in FIGS. 3A-3J. In FIG. 3A, the process begins with the formation of a gate dielectric layer 212 on a substrate 210 by conventional methods. The substrate 210 consists of monocrytalline silicon doped to a p+ concentration for an NMOS device or to a n+ concentration for a PMOS device. The gate dielectric layer 212 consists of a dielectric material such as silicon dioxide.

Figure 3B:
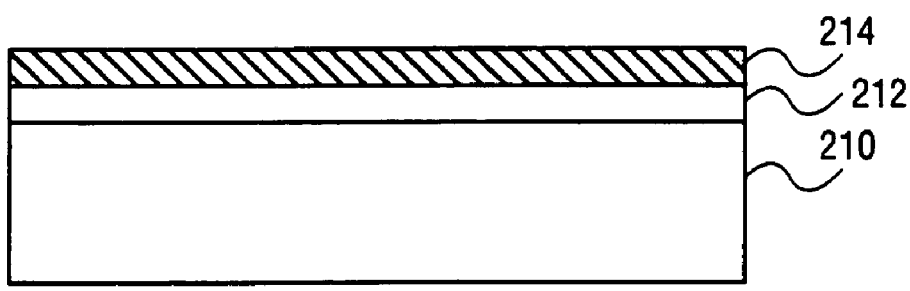
Figure 3C:
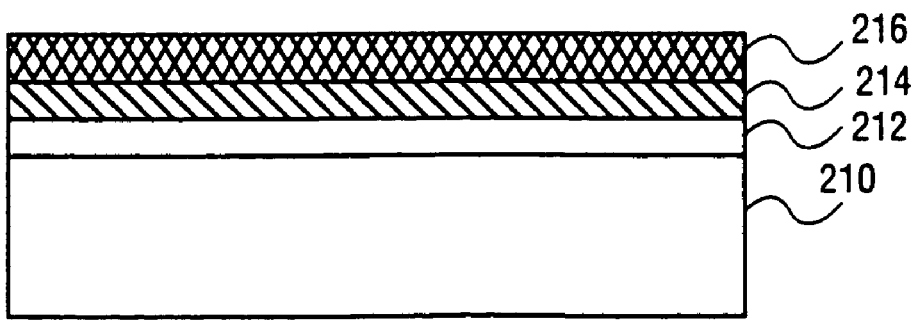

In FIGS. 3B-3C, a first metallic layer 214 is blanket deposited on the gate dielectric layer 212, and a second metallic layer 216 is blanket deposited on the first metallic layer 214. Deposition can be accomplished by any one of the known methods of depositing thin metallic layers on a semiconductor device. Known methods of deposition include, but are not limited to, gas-phased depositions such as chemical vapor deposition (CVD) and physical vapor deposition (PVD), or mechanical deposition such as sputtering.

The first metallic layer 214 should be made of a material that resists impurity diffusion. But, at the same time, the first metallic layer 214 should be made of a material with a low density of states or high resistivity, so that its work function can be easily overwhelmed by that of the second metallic layer 216. Some examples of materials that can be used for the first metallic layer 214, therefore, are metal nitrides including titanium nitride (TiN) and tantalum nitride (TaN). The barrier properties of the first metallic layer can be enhanced by adding silicon or zirconium.

In addition, the first metallic layer 214 should be thick enough to act as an adequate barrier to prevent the second metallic layer 216 from diffusing into the gate dielectric layer 212. However, the first metallic layer 214 should be thin enough so that a subsequent wet-etch will not excessively undercut the sidewalls of the layer. Wet-etches generally suffer from undercutting because the liquid of the wet-etch tends to cut as much laterally as it does vertically. However, an advantage of the present invention is that if the metallic layers are thin enough, the liquid from the wet-etchant will not be able to form a beaded edge and cut into the sidewalls of the metal gate. This is similar to a capillary effect wherein liquid from an artery will not diffuse into capillaries if the capillary openings are small enough. Therefore, in one embodiment, the first metallic layer 214 should have a thickness approximately between 10 to 25 angstroms. Within this range, the first metallic layer 214 is thick enough to provide barrier protection, but also will not be excessively undercut during a wet-etch. To improve the barrier properties of a first metallic layer 214, silicon (Si) or zirconium (Zr) can be added to approximately 5% constitution. The addition of Si or Zr disrupts vertical grain structures in the metal which further impedes diffusion of second metallic metal 216 through the first layer 214.

The second metallic layer 216 sets the work function of the entire gate electrode. Therefore, the second metallic layer 216 should be made of a material that has a higher work function than the first metallic layer 214 so that the work function of the first metallic layer 214 can be overwhelmed by the second metallic layer 216. In one embodiment, the material of the second metal layer 216, for a NMOS device, has a work function of 4.11 eV±0.2 eV. Examples of materials with work functions of 4.11 eV±0.2 eV include titanium, tantalum, zirconium, and hafnium. In another embodiment, for a PMOS device, the material of the second metal layer 216 has a work function of 5.2 eV±0.2 eV. Examples of materials with work functions of 5.2 eV±0.2 eV include platinum, palladium, nickel, cobalt, and ruthenium.

In addition, the second metallic layer 216 should be formed at least as thick as the metallic layer 214. However, the second metallic layer 216 must also be thin enough so that the sidewalls of the metallic layer will not be laterally cut during a subsequent wet-etch. Therefore, in one embodiment, the thickness of the second metallic layer 216 is approximately between 25 to 150 angstroms.

Figure 3D:
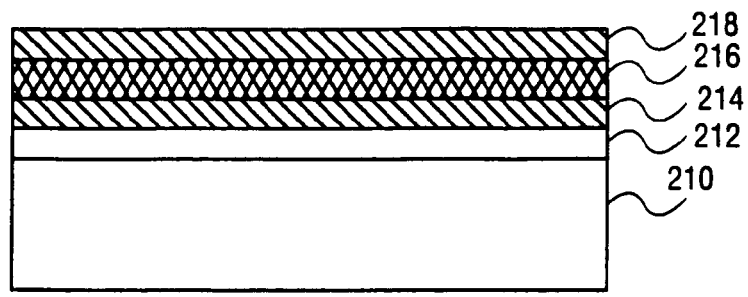
Figure 3E:
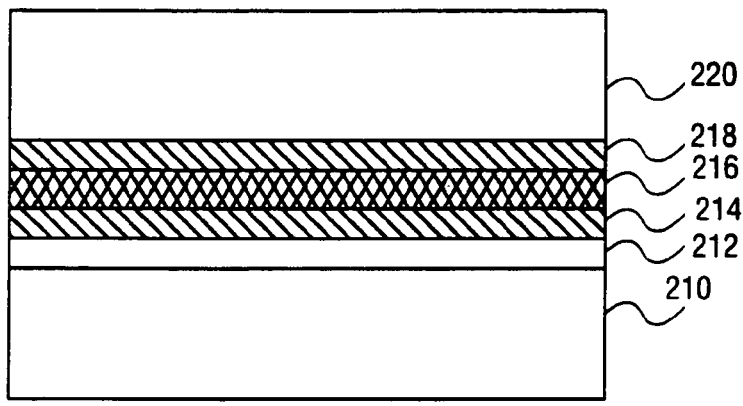

In FIGS. 3D-3E, a third metallic layer 218 is blanket deposited on the second metallic layer 216 and a doped polysilicon layer 220 is blanket deposited on the third metallic layer.

The third metallic layer 218 is also deposited by any one of the known methods of depositing thin metallic layers on a semiconductor device. The third metallic layer 218 acts as a silicidation barrier between the second metallic layer 216 and the doped polysilicon layer 220. For the third metallic layer 218 to act as an effective silicidation barrier, it should be made of a material that is highly resistant to silicidation. Some examples of materials that can be used for the third metallic layer 218, therefore, include metal nitrides, such as titanium nitride (TiN) and tantalum nitride (TaN). Zr and Si could be added to this barrier to improve the barrier properties of the metal film.

Several advantages arise from forming a barrier layer like the third metallic layer 218. If the third metallic layer 218 were missing, the high temperature of the polysilicon deposition (around 600° C.) would cause the second metallic layer 216 to silicidize at the junction of the doped polysilicon layer 220, thus forming a silicide layer between the second metallic layer 216 and the doped polysilicon layer 220. A silicide layer is typically very rough. The roughness of the silicide layer would scatter photons during the alignment process of a subsequent photolithography procedure, thus making the alignment process very difficult. In addition, a silicide layer is typically very hard, thus it is difficult to etch. Furthermore, because the second metallic layer 216 is so thin, the silicidation would consume a large portion of the second metallic layer 216, which could greatly affect the work function of the second metallic layer 216, which in turn would affect the work function of the entire gate electrode structure. Thus, by forming a barrier layer like the third metallic layer 218, all of these common disadvantages of silicidation are avoided.

The third metallic layer 218 should be thick enough so that the second metallic layer 216 is protected from silicidizing with the polysilicon. However, like the other metallic layers, the third metallic layer 218 should be thin enough that a subsequent wet-etch will not excessively undercut the sidewalls of the layer. Therefore, in one embodiment, thickness of the third metallic layer 218 is approximately 25 to 50 angstroms. Considering the respective thickness of the three metallic layers, in one embodiment, the combined thickness of the three metallic layers is therefore between 60 to 225 angstroms.

In addition, the third metallic layer 218, as well as the other metallic layers, must be able to withstand the high temperature of the activation anneal process. Thus, the first, second and third metallic layers 214, 216, and 218 should have melting temperatures above 1200° C.

The doped polysilicon layer 220 should be thick enough to act as a mask during a subsequent ion implantation process, but not so thick it will excessively slow current flow or disrupt the work function of the gate. Thus, in one embodiment, the polysilicon layer should have a thickness of between approximately 1000 to 2000 angstroms.

Figure 3F:
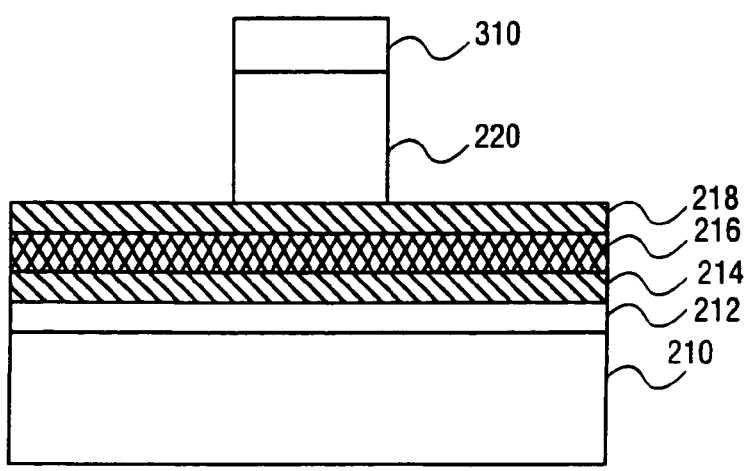

In FIG. 3F, the doped polysilicon layer 220 is patterned using conventional methods. In one embodiment, a photolithography process is used wherein the doped polysilicon layer 220 is masked and dry-etched to prevent lateral undercutting of the doped polysilicon layer. The underlying metallic layers can be used as an etch stop. Furthermore, in one embodiment, a hard mask 310 is used during the patterning of the doped polysilicon layer 220, then subsequently removed.

Figure 3G:
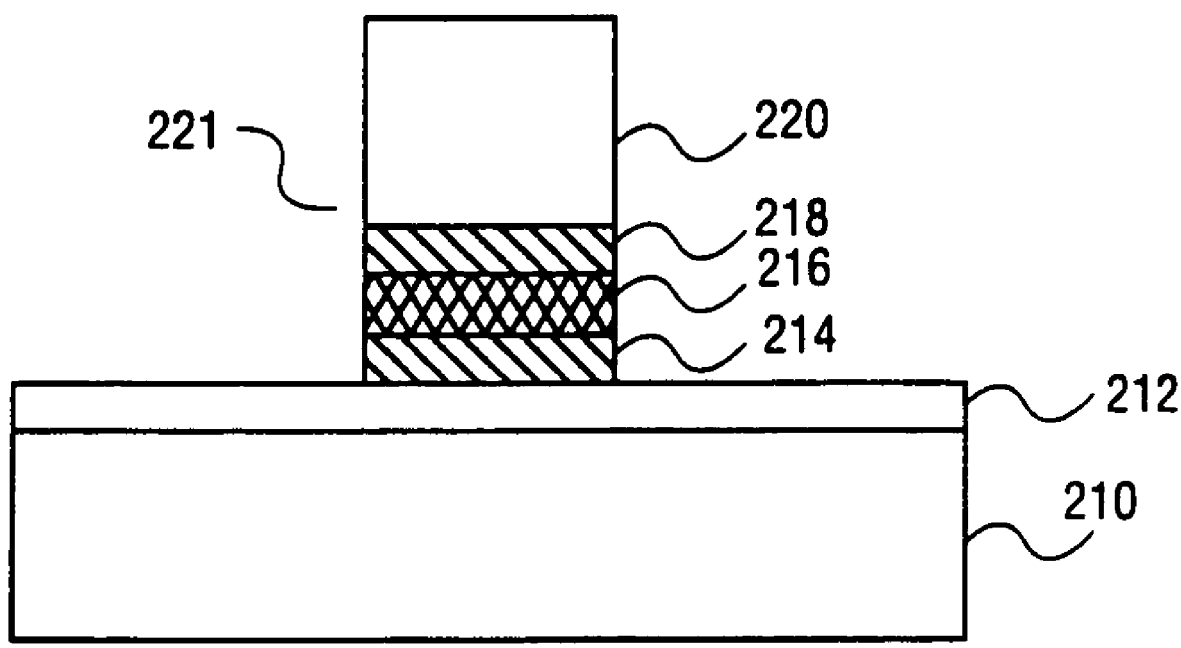

In FIG. 3G, the metallic layers 214, 216, and 218 are etched using the polysilicon layer 220 to align the etching. Together the metallic layers 214, 216, and 218 and the polysilicon comprise the gate electrode structure 221. In one embodiment, the metallic layers are dry-etched. Thus, the fabrication etching tools do not have to be removed and replaced with other tools after the polysilicon layer 220 is etched, thus making the fabrication process more efficient. However, because the metallic layers are so thin, wet-etching will have a negligent lateral cutting effect. Thus, in one embodiment, the metallic layers are wet-etched. Wet-etching the thin metals is advantageous because wet-etching is typically more complete and ultimately not as forceful as dry-etching. In one embodiment, the wet-etchant is formed by heating a 2:1:1 solution of $H_2O: H_2O_2:H_2SO_4$ at a temperature of 70° C. for 2 minutes.

Figure 3H:
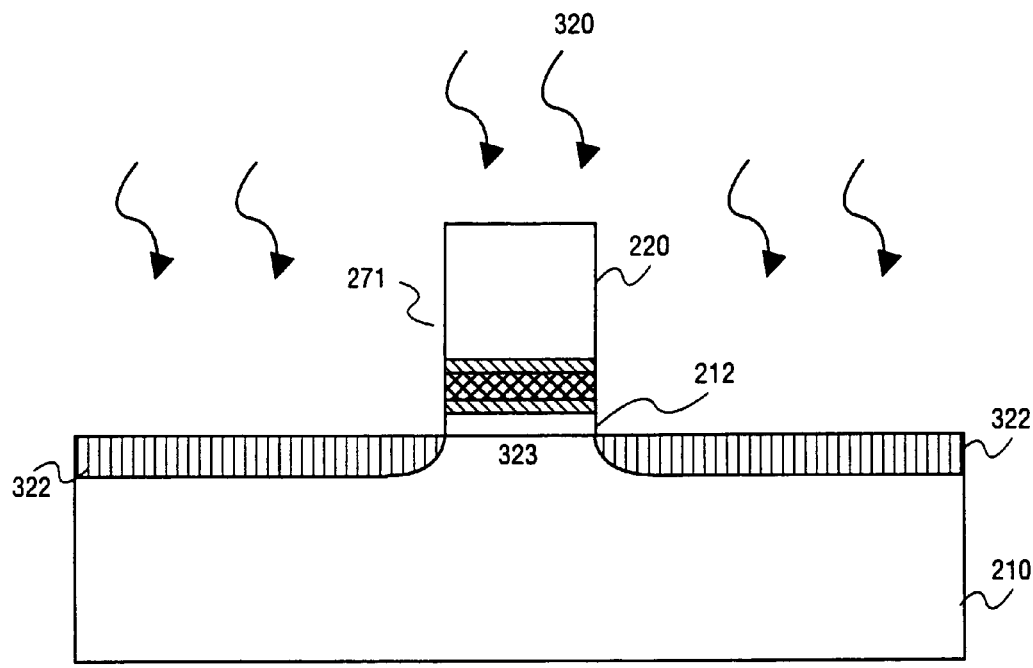

In FIG. 3H, the gate dielectric layer 212 is etched and the substrate undergoes an ion implantation and high temperature activation anneal to form the shallow doped portions 322. During the implantation process, ionized dopant 320 is directed downward at the doped monocrystalline silicon substrate 210. Conventionally, the ionized dopant 320 is an opposite type dopant than that used to initially dope the monocrystalline silicon substrate 210. The polysilicon layer 220 acts as a mask to prevent the ionized dopant 320 from passing through the gate electrode structure 221. To enable wet-etch patterning, the materials used for the metallic layers are very thin compared to doped polysilicon 220. Thus, if the doped polysilicon layer 220 were not present, the ionized dopant 320 would easily pass through the metallic layers and react with the gate dielectric layer 212, or the substrate portion 323 underneath the gate dielectric layer 212. This would have a detrimental effect on the transistor and could possibly render it inoperable.

Figure 3I:
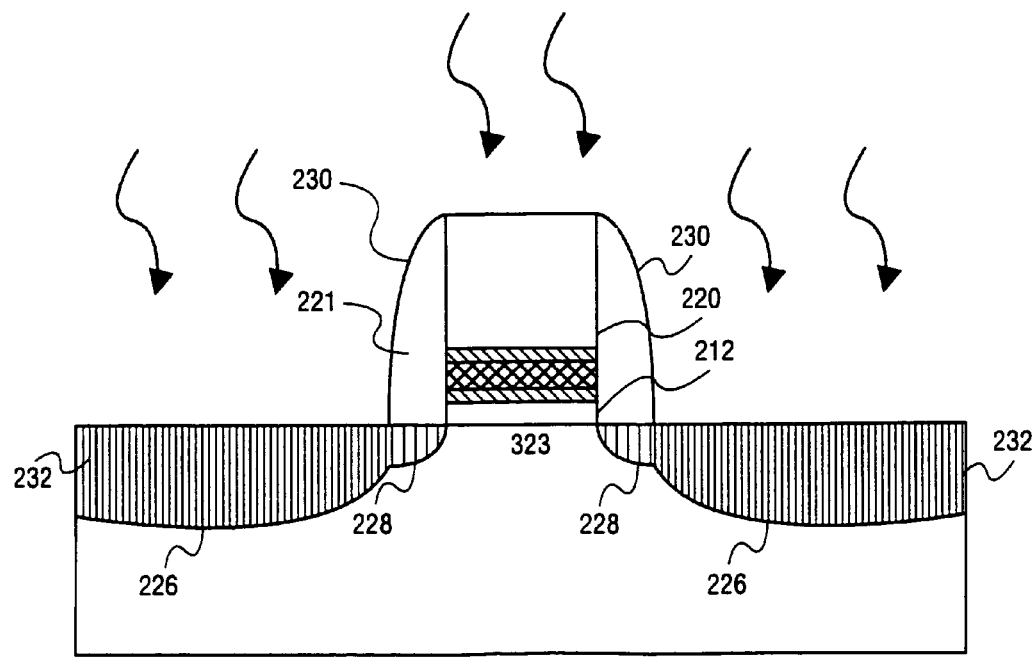

FIG. 3I shows the formation of dielectric spacers 230 and a second ion implantation and high temperature activation anneal to form deeper source/drain regions 232 on the substrate, as is well known in the art. Again polysilicon layer 220 acts as a mask during the second implant process protecting the gate dielectric layer 212 and substrate portion 323 under the gate electrode 221 from the second dopant 324.

Figure 3J:
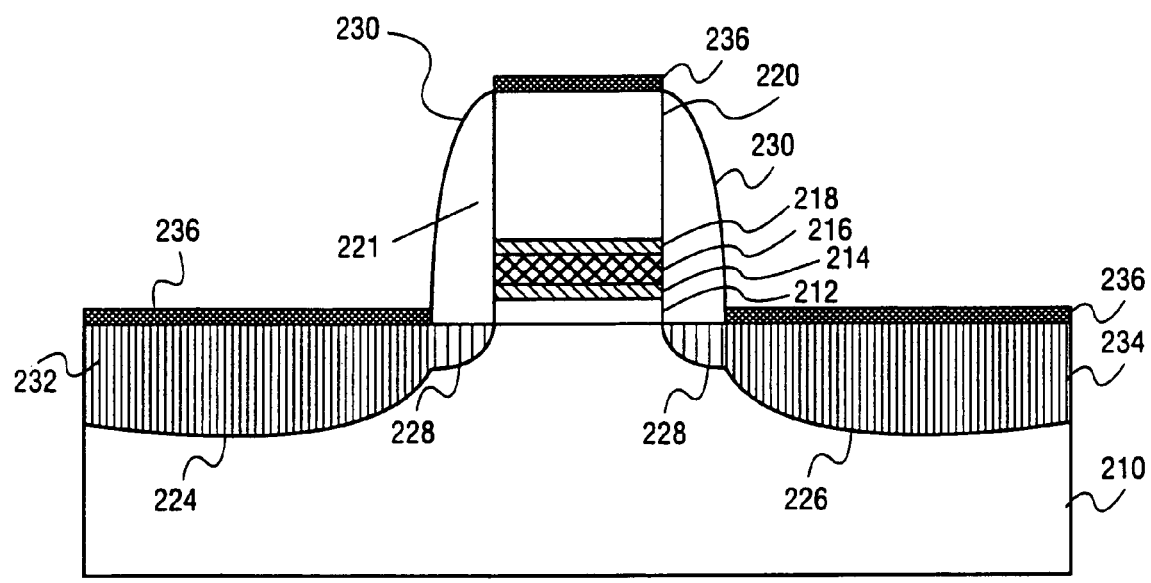

FIG. 3J shows the formation of a silicide layer 236 over the polysilicon layer 220 and the deeply doped regions 232. The silicide layer 236 can subsequently be coupled to metal interconnect lines which run throughout the integrated circuit.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art. In other instances well known semiconductor fabrication processes, techniques, materials, equipment, etc., have not been set forth in particular detail in order to not unnecessarily obscure the present invention.

We claim:

1. A MOS transistor structure comprising:
   a gate dielectric layer; and
   a gate electrode structure on the gate dielectric layer that comprises
      a first metallic layer having a first work function on top of the gate dielectric layer, wherein the first metallic layer has a first thickness from 10 to 25 angstroms, a second metallic layer having a second work function on the first metallic layer, wherein the second metallic layer has a second thickness that does not exceed 150 angstroms, wherein the second metallic layer has a conductivity and density of states higher than the first metallic layer, wherein the first work function is overcome by the second work function, and a third metallic layer on the second metallic layer, wherein the third metallic layer has a third thickness that does not exceed 50 angstroms; and a polysilicon layer on top of the third metallic layer, wherein the gate electrode structure has an overall work function, wherein the second metallic layer having the second work function sets the overall work function of the gate electrode structure, wherein the first metallic layer acts as a diffusion barrier between the gate dielectric layer and the second metallic layer and the third metallic layer acts as a silicidation barrier between the second metallic layer and the polysilicon layer, wherein first metallic layer includes zirconium added to titanium nitride or tantalum nitride.

2. The gate electrode structure of claim 1, wherein the second metallic layer comprises a material selected from the group consisting of platinum, palladium, nickel, cobalt, and ruthenium for a p-type device.

3. The gate electrode structure of claim 1, wherein the material of the third metallic layers is a metal nitride.

4. The gate electrode structure of claim 1 further comprising a silicide layer.

5. The gate electrode structure of claim 1, wherein the second thickness is from 25 to 150 angstroms, the third thickness is from 25 to 50 angstroms, and a total thickness of first metallic layer, the second metallic layer, and the third metallic layer is between 60 angstroms and 225 angstroms, and wherein the polysilicon layer has a fourth thickness from 1000 angstroms to 2000 angstroms.

6. The gate electrode structure of claim 1, wherein the second work function is a work function of 5.2 eV±0.2 eV for a p-type device.

7. The gate electrode structure of claim 1, wherein the third metallic layer includes zirconium added to titanium nitride or tantalum nitride.

8. The gate electrode structure of claim 1, wherein the third metallic layer includes silicon added to titanium nitride or tantalum nitride.

* * * * *